(12) United States Patent
Namasivayam et al.

(10) Patent No.: US 8,732,224 B1
(45) Date of Patent: May 20, 2014

(54) METHOD AND APPARATUS FOR IMPLEMENTATION OF HIGH ORDER MASH BY REUSE OF SINGLE STAGE MASH

(75) Inventors: Vasanth Krishna Namasivayam, Fremont, CA (US); Tao Jing, Fremont, CA (US)

(73) Assignee: Integrated Device Technology, Inc., San Jose, CA (US)

(*) Notice: Subject to any disclaimer, the term of this patent is extended or adjusted under 35 U.S.C. 154(b) by 576 days.

(21) Appl. No.: 12/889,331

(22) Filed: Sep. 23, 2010

(51) Int. Cl.
*G06F 7/38* (2006.01)

(52) U.S. Cl.
USPC .......................................... 708/490; 708/200

(58) Field of Classification Search
None
See application file for complete search history.

(56) References Cited

U.S. PATENT DOCUMENTS

| 5,196,850 A * | 3/1993 | Duffy et al. ................ 341/76 |
| 2009/0109076 A1 * | 4/2009 | Jalan ............................ 341/143 |

* cited by examiner

*Primary Examiner* — Michael D Yaary
(74) *Attorney, Agent, or Firm* — Heimlich Law, PC; Alan Heimlich, Esq.

(57) ABSTRACT

A method and apparatus for implementation of high order MASH by reuse of single stage MASH have been described.

9 Claims, 7 Drawing Sheets

1. A multi stage noise shaping method comprising using a single adder to accumulate one or more inputs, wherein said one or more inputs are delayed.

701

2. The method of claim 1 further comprising using said single adder to accumulate an input which is not delayed.

702

3. The method of claim 1 wherein said single adder outputs a completion signal.

703

4. The method of claim 3 wherein said completion signal is based on a sum output from said single adder and a carryout output from said single adder.

704

5. The method of claim 4 wherein said one or more inputs are delayed based on said completion signal.

705

6. The method of claim 5 wherein said single adder accumulates monotonically from a most delayed of said one or more inputs to a least delayed of said one or more inputs.

706

7. A multi stage noise shaping apparatus comprising:
    an input control logic block having an input and an output;
    an adder having a first input and a second input, a sum output, a carryout output, and a completion output, wherein said first input is coupled to receive a signal which is not time delayed, and said second input is coupled to said input control logic output; and
    an output control logic block having a plurality of inputs coupled to receive said sum output, and said carry output, and said completion output, and said output control logic block having an output.

707

8. The apparatus of claim 7 further comprising said output control logic block output coupled to said input control logic block input.

708

9. The apparatus of claim 8 wherein in said coupled is based on said adder completion output.

METHOD AND APPARATUS FOR IMPLEMENTATION OF HIGH ORDER MASH BY REUSE OF SINGLE STAGE MASH

FIELD OF THE INVENTION

The present invention pertains to Multi-stAge noise SHaping (MASH). More particularly, the present invention relates to a method and apparatus for implementation of high order MASH by reuse of single stage MASH.

BACKGROUND OF THE INVENTION

The MASH (Multi stage noise shaping) is extensively used in timing circuits including video timing controllers, USB timing controllers, consumer and PC clocks, etc. It is used primarily in fractional dividers.

Figure 3:
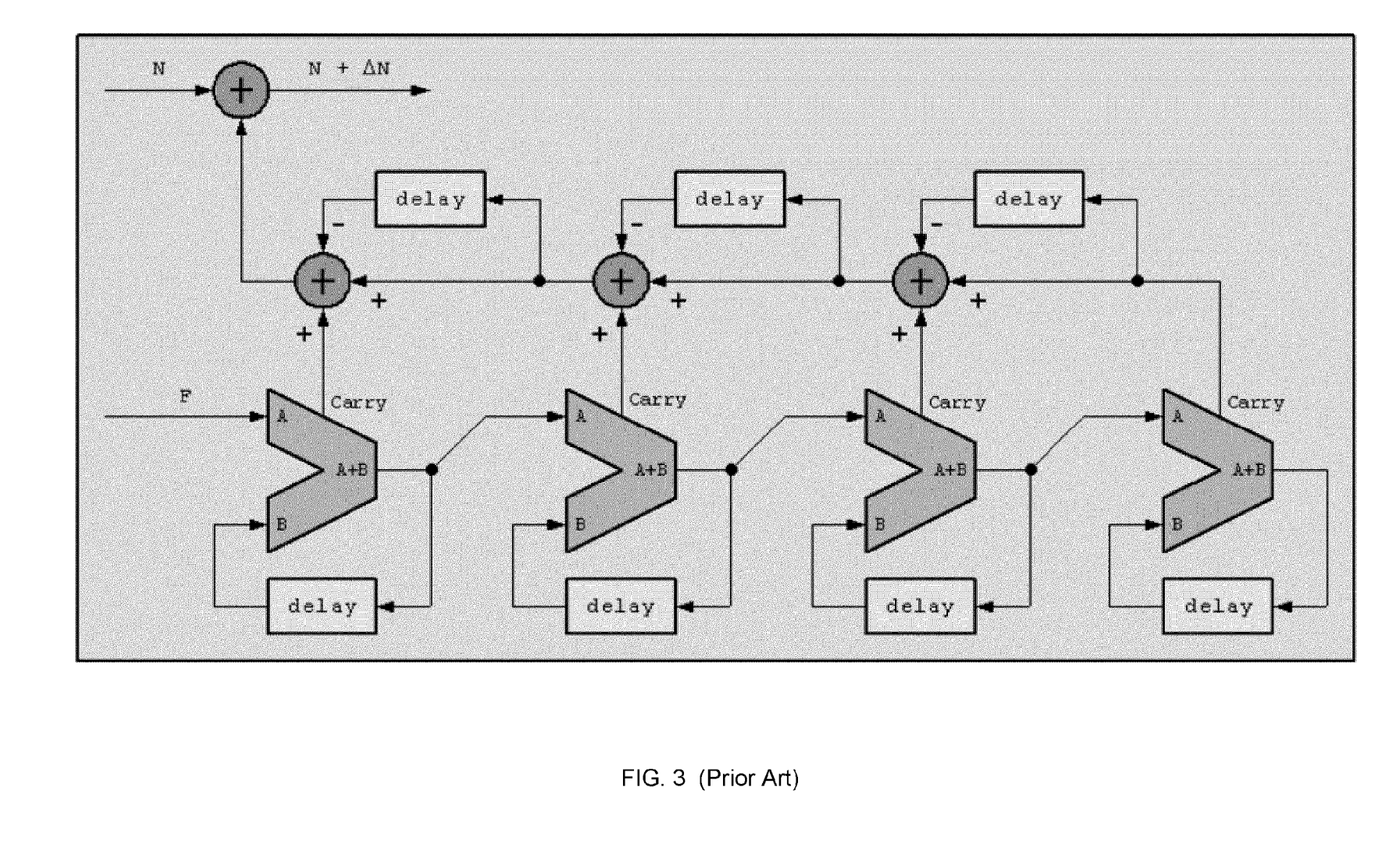
FIG. 3 illustrates a traditional state of the art MASH architecture showing 4 adders.
Figure 4:
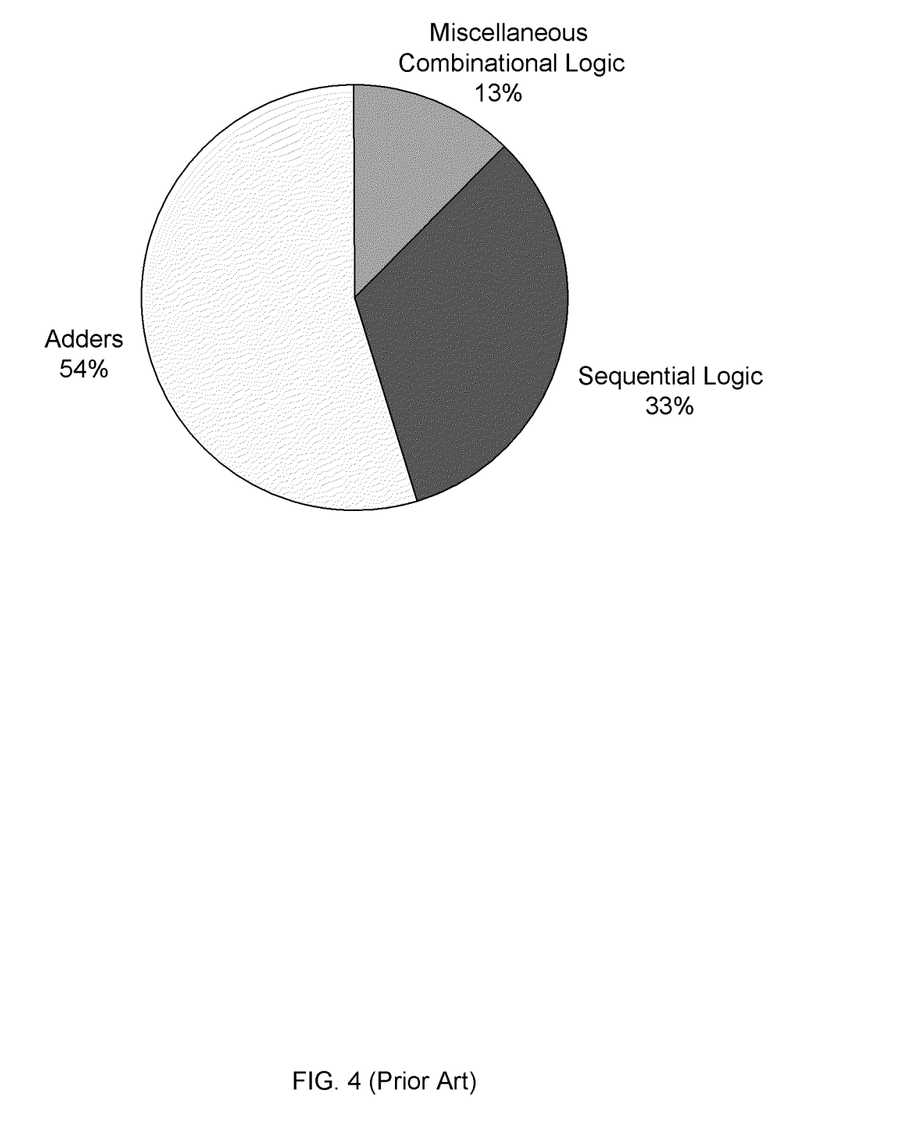
FIG. 4 illustrates a traditional state of the art MASH architecture showing a representative example of area consumed by various logic functions.

In a traditional state of the art MASH architecture the number of accumulators (adders) increases linearly with the order of the MASH (see FIG. 3). Additionally the area breakdown of a traditional state of the art MASH architecture shows a significant area is consumed by adders (see FIG. 4 showing a representative example of area).

There is a continuing desire to use higher order MASH architectures to improve the noise shaping abilities. Thus, more and more area is consumed by the accumulators. This presents a problem.

BRIEF DESCRIPTION OF THE DRAWINGS

The invention is illustrated by way of example and not limitation in the figures of the accompanying drawings in which.

DETAILED DESCRIPTION

In one embodiment of the invention a resource sharing architecture using an adder with completion logic is used.

In one embodiment of the invention multiple adder stages are replaced with a single adder stage which sequentially operates with different operands.

In one embodiment of the invention an area efficient n-order MASH (Multi stage noise shaping) saves about 30-40% area as compared to a traditional state of the art MASH structure.

In one embodiment of the invention the same adder unit is shared between every stage of the MASH in a time multiplexed fashion.

In one embodiment of the invention the shared same adder is used for all the stages and has been modified from a basic adder circuit with the addition of completion logic, which indicates when the addition is completed.

In one embodiment of the invention the completion logic in the shared adder unit looks at the sum and carryout to determine when an addition is complete.

In one embodiment of the invention when the completion logic indicates that the adder unit has completed the addition, the adder unit moves on to the next stage of any remaining addition.

In one embodiment of the invention it is also possible to perform addition from the Nth stage to the first stage in reverse order.

In one embodiment of the invention, even accounting for the addition of the control logic there are area savings which increases with the order of the MASH.

Figure 5:
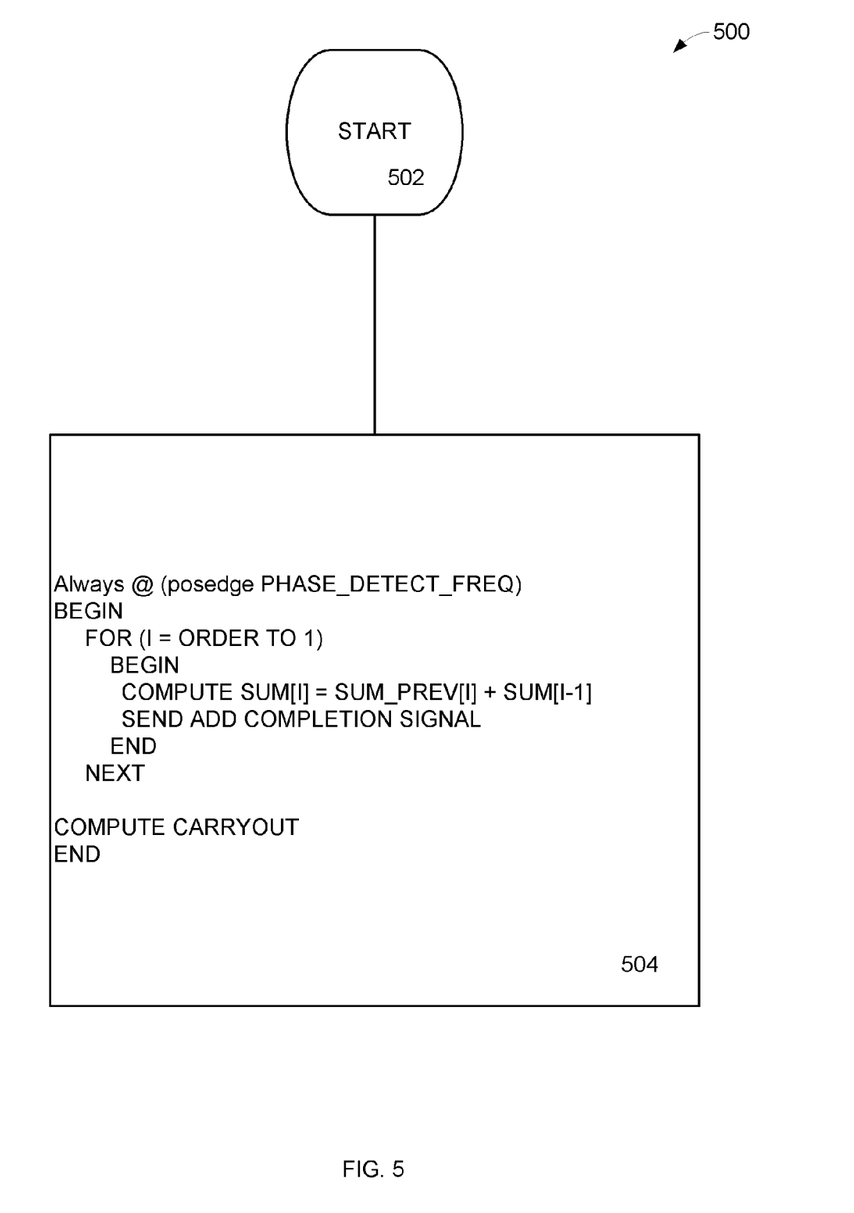
FIG. 5 illustrates one embodiment of the invention showing a flow chart and pseudo-code.

FIG. 5 illustrates, generally at 500, one embodiment of the invention showing flow chart and pseudo-code. At 502 the process starts. At 504 is pseudo-code.

```
Always @ (posedge PHASE_DETECT_FREQ)
BEGIN
    FOR (I=ORDER TO 1)
      BEGIN
        COMPUTE SUM[I]=SUM_PREV[I]+SUM[I-1]
        SEND ADD COMPLETION SIGNAL
      END
    NEXT
COMPUTE CARRYOUT
END
```

The pseudo-code waits to begin by waiting for a positive edge of a phase detected frequency.

Next there is a for loop than starts at the order of the MASH and steps by increments of −1 until it reaches 1.

During the for loop a sum is computed and when each sum is completed there is sent an add completion signal signifying completion of computing that sum.

The for loop is repeated until done.

Next a carryout is computed and the process ends.

The above BEGIN-END sequence is repeated for each COMPUTE CARRYOUT that is computed.

Figure 6:
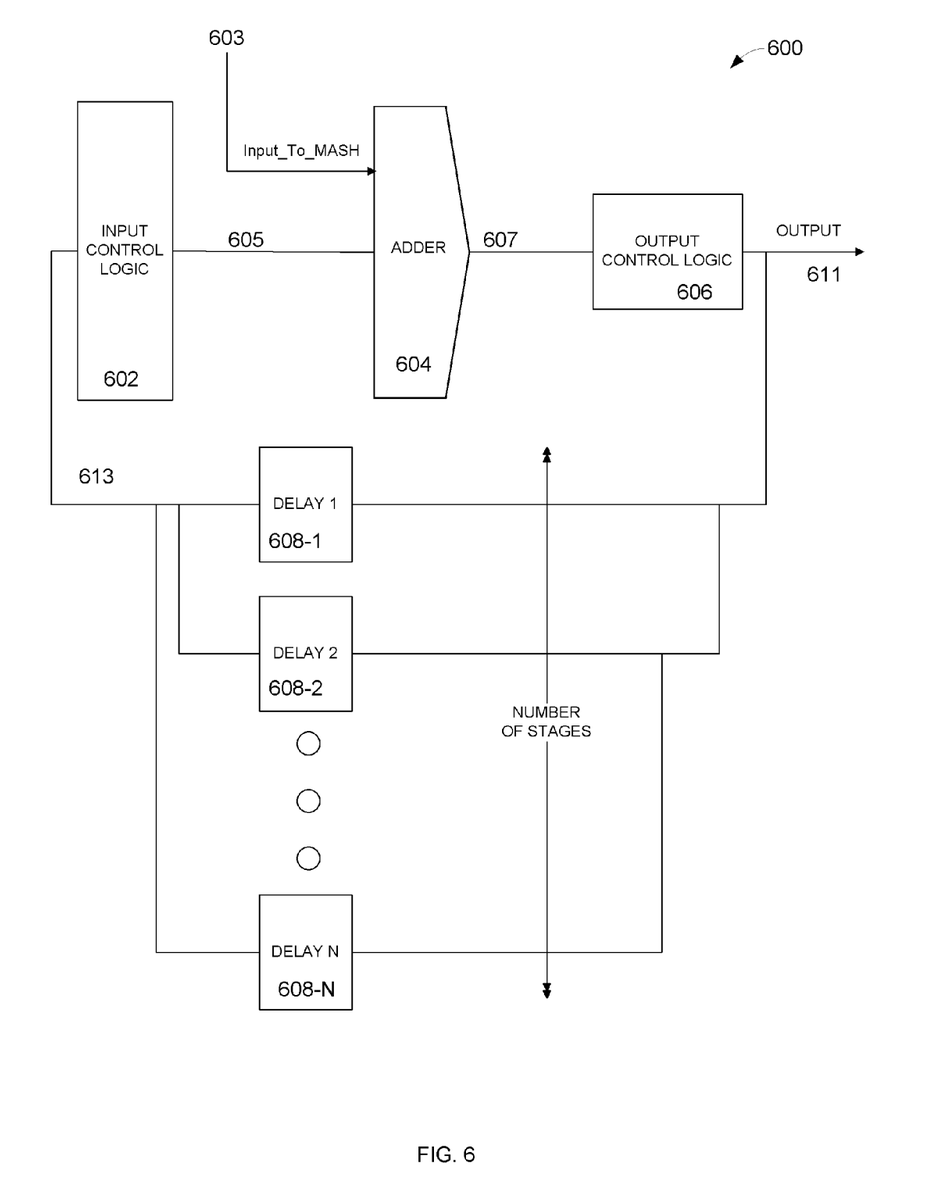
FIG. 6 illustrates one embodiment of the invention showing a block diagram.

FIG. 6 illustrates, generally at 600, one embodiment of the invention showing a block diagram.

At 602 is an input control logic that receives input from 613 the output of Delay 1 (608-1) on the first pass through, the output 613 of Delay 2 (608-2) on the second pass through, etc. to the output 613 of Delay N (608-N) on the Nth pass through.

At 603 is input to the adder unit 604.

At 605 is input control logic for the adder 604.

At 607 the output of the adder unit 604 which has a sum and carry (e.g. an implementation of part of FIG. 5) is communicated to the output control logic block 606 which produces an output 611.

Output 611 goes to Delay 1 (608-1) on the first pass through, to Delay 2 (608-2) on the second pass through, etc. to Delay N (608-N) on the Nth pass through.

The number of delays, for example, N as illustrated in FIG. 6 (e.g. Delay 1 (608-1), Delay 2 (608-2), to Delay N (608-N)) represents the number of stages.

One of skill in the art will appreciate that a delay can be used to time multiplex the use of an adder unit, such as illustrated at 604 in FIG. 6.

As illustrated in FIG. 6 are shown delays Delay 1, Delay 2, . . . , Delay N (6-8-1, 608-2, . . . , 608-N respectively). One of skill in the art appreciates that delays such as these may be implemented in a variety of ways. For example, a clocked flip-flop may be used to effect a delay in a signal. Additionally by choosing the rate at which such a flip-flop may be clocked the delay can be varied. The source of this clock signal for the flip-flop may come from a variety of sources, such as, but not limited to, a user programmable register, an adder completion signal, a clocked adder completion signal, an output control logic block, etc.

As illustrated in FIG. 6 input 603 goes to adder 604. Input to 603 may be from a variety of sources, for example, but not limited to, digital inputs, a user programmable register, an output of an ND conversion of, for example, a bandgap temperature sensor, etc.

For illustration purposes the lines in FIG. 6 illustrating busses for example, 603, 605, 607, 611, 613 are drawn as a single line so as not to obscure the invention, however, they are to be understood to be busses of a width as required in an application (e.g. 4 bits, 8 bits, 16 bits, 20 bits, 24 bits, 32 bits, 64 bits, . . . , etc.). Additionally, the output 607 of Adder 604 is understood to carry such results as a sum output, a carryout output, and a completion output.

For illustration purposes, the techniques of the present invention have been illustrated using a single adder unit, however the invention is not so limited and more than a single adder may be used in the sharing fashion disclosed above. One of skill in the art will appreciate the tradeoffs in area and performance when using multiple shared adders or other shared logic.

Additionally, techniques of the present invention may be expanded to use multiple single adder units for increased performance. For example, if the order of the unit is high (e.g. number of stages as noted in FIG. 6) and timely throughput is an issue, a second unit (e.g. as illustrated in FIG. 6) may be run in parallel with a first unit and the outputs from the first unit and the second unit may be multiplexed when completed to provide a faster output (e.g. ping-pong the units output).

Figure 7:
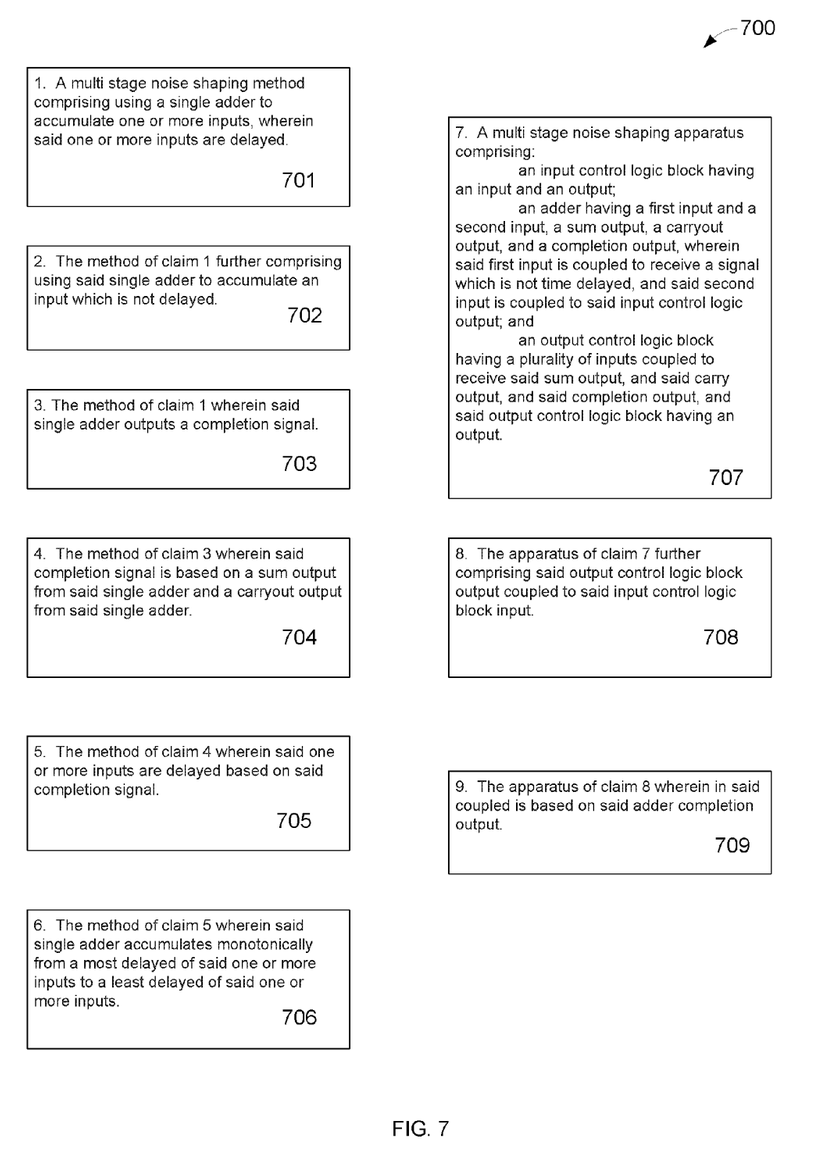
FIG. 7 illustrates embodiments of the invention.

FIG. 7 illustrates, generally at 700, embodiments of the invention.

At 701 is 1. A multi stage noise shaping method comprising using a single adder to accumulate one or more inputs, wherein said one or more inputs are delayed.

At 702 is 2. The method of claim 1 further comprising using said single adder to accumulate an input which is not delayed.

At 703 is 3. The method of claim 1 wherein said single adder outputs a completion signal.

At 704 is 4. The method of claim 3 wherein said completion signal is based on a sum output from said single adder and a carryout output from said single adder.

At 705 is 5. The method of claim 4 wherein said one or more inputs are delayed based on said completion signal.

At 706 is 6. The method of claim 5 wherein said single adder accumulates monotonically from a most delayed of said one or more inputs to a least delayed of said one or more inputs.

At 707 is 7. A multi stage noise shaping apparatus comprising:
   a input control logic block having an input and an output;
   an adder having a first input and a second input, a sum output, a carryout output, and a completion output, wherein said first input is coupled to receive a signal which is not time delayed, and said second input is coupled to said input control logic output; and
   an output control logic block having a plurality of inputs coupled to receive said sum output, and said carry output, and said completion output, and said output control logic block having an output.

At 708 is 8. The apparatus of claim 7 further comprising said output control logic block output coupled to said input control logic block input.

At 709 is 9. The apparatus of claim 8 wherein in said coupled is based on said adder completion output.

Thus a method and apparatus for implementation of high order MASH by reuse of single stage MASH have been described.

Figure 1:
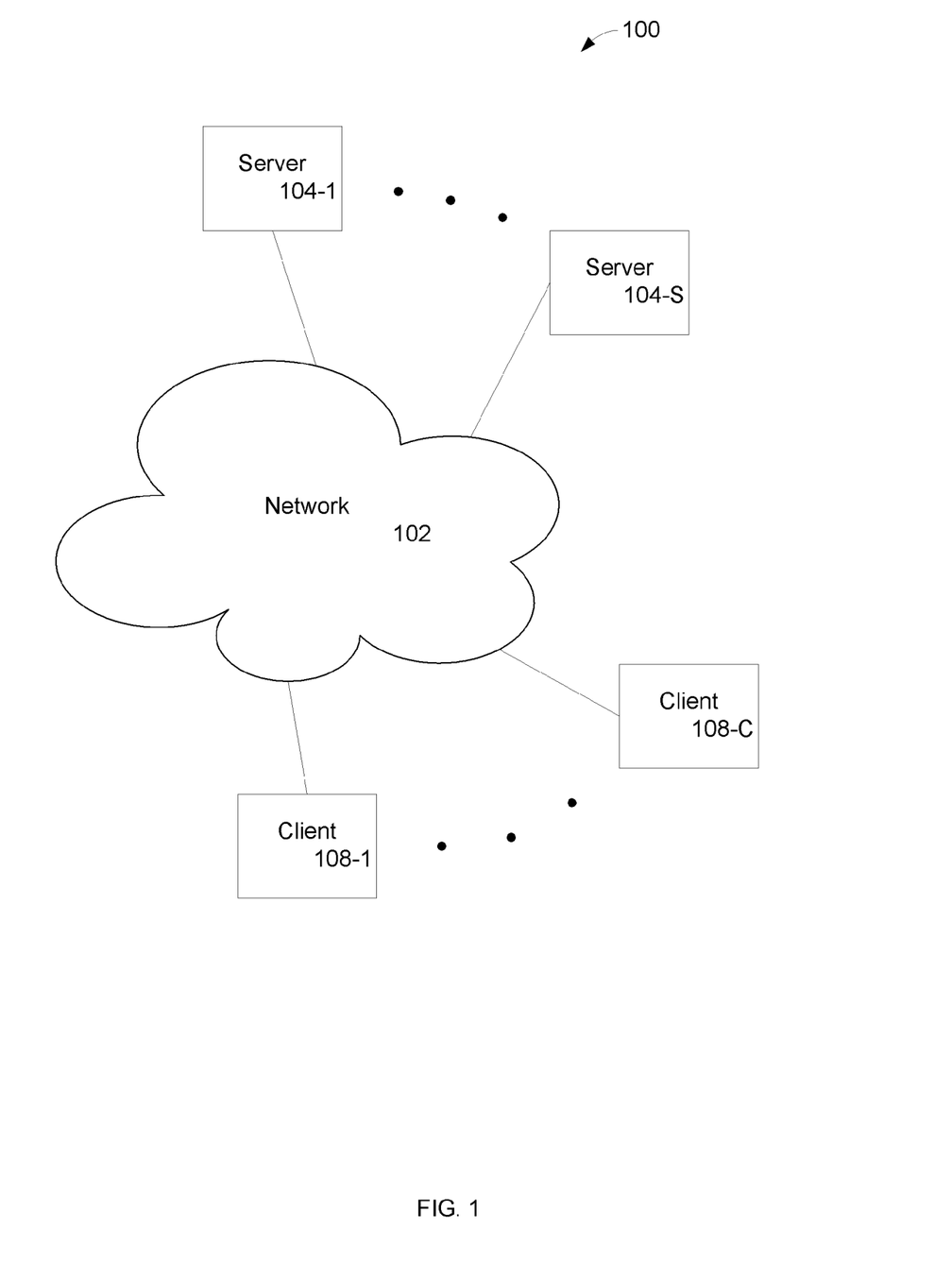
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
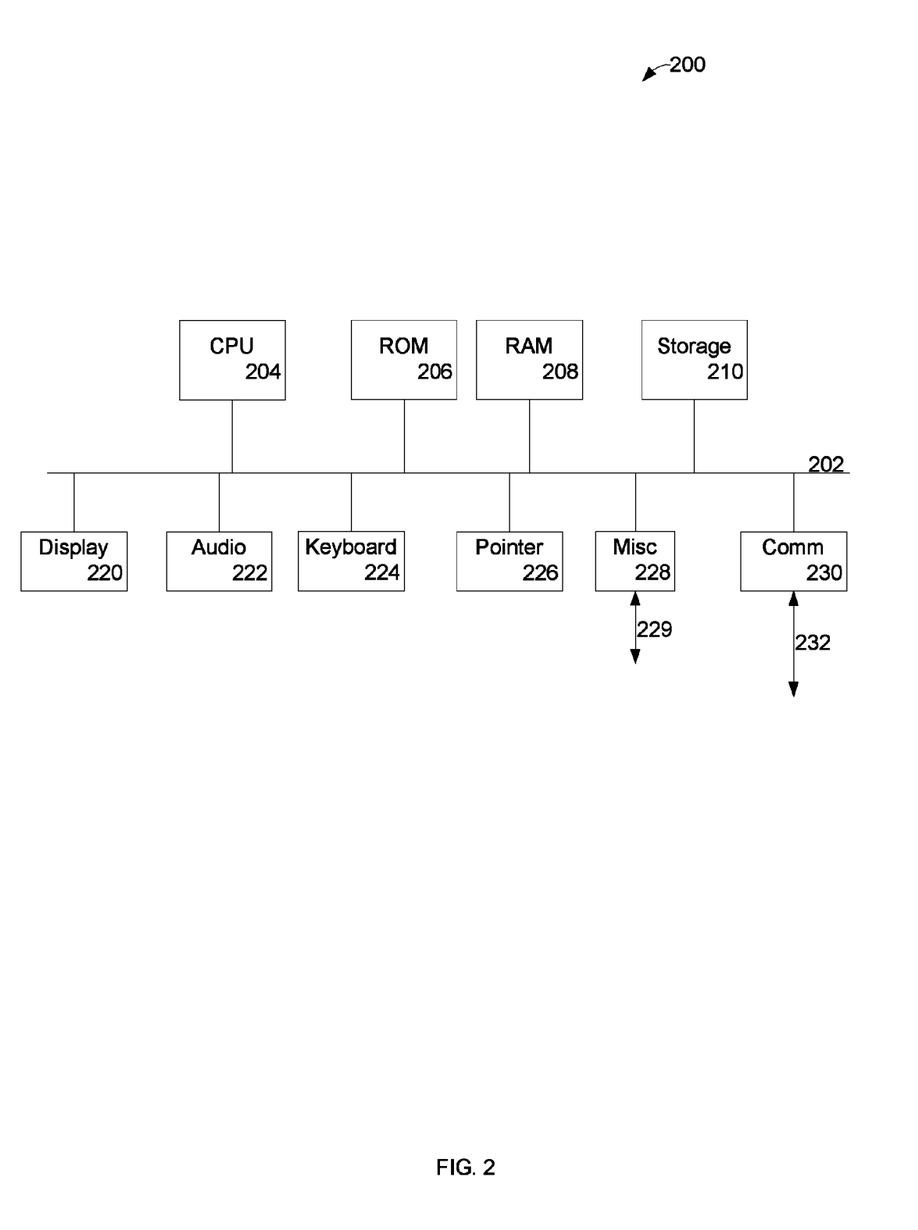
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228 via link 229, and communications 230 via link 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does one embodiment" imply that there is but a single embodiment of the invention. For example, a feature, structure, act, etc. described in one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for implementation of high order MASH by reuse of single stage MASH have been described.

What is claimed is:

1. A multi stage noise shaping method comprising using a single adder circuitry looping to accumulate one or more inputs to said single adder, wherein said one or more inputs are delayed, wherein said single adder has a sum output, a carryout output, and a completion signal, and wherein for an N stage entity said single adder loops N times generating for each of said N loops said sum output, said carryout output, and said completion signal.

2. The method of claim 1 further comprising using said single adder to accumulate an input which is not delayed.

3. The method of claim 1 wherein said single adder outputs a completion output when said N loops are completed.

4. The method of claim 2 wherein said completion signal is based on a said sum output from said single adder and a said carryout output from said single adder.

5. The method of claim 4 wherein said one or more inputs are delayed based on said completion signal.

6. The method of claim 5 wherein said single adder accumulates monotonically from a most delayed of said one or more inputs to a least delayed of said one or more inputs.

7. A multi stage noise shaping apparatus comprising:

an input control logic block circuitry having an input and an output;

an adder having a first input and a second input, a sum output, a carryout output, and a completion output, wherein said first input is coupled to receive a signal which is not time delayed, and said second input is coupled to said input control logic output; and an output control logic block having a plurality of inputs coupled to receive said sum output, and said carry output, and said completion output, and said output control logic block having an output.

8. The apparatus of claim 7 further comprising said output control logic block output coupled to said input control logic block input.

9. The apparatus of claim 8 wherein said coupled is based on said adder completion output.

* * * * *